(12) United States Patent
Polnyi

(10) Patent No.: US 7,267,558 B1
(45) Date of Patent: Sep. 11, 2007

(54) ELECTRICAL CONNECTOR WITH CONTACT

(75) Inventor: Igor Polnyi, Aurora, IL (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/509,535

(22) Filed: Aug. 24, 2006

(51) Int. Cl.
*H01R 12/00* (2006.01)
(52) U.S. Cl. .......................................... 439/81
(58) Field of Classification Search ............. 439/81–83
See application file for complete search history.

(56) References Cited

U.S. PATENT DOCUMENTS

| | | | | |
|---|---|---|---|---|
| 4,940,181 | A * | 7/1990 | Juskey et al. ........... 228/180.21 |
| 5,459,287 | A * | 10/1995 | Swamy ....................... 174/266 |
| 5,746,608 | A * | 5/1998 | Taylor ........................... 439/70 |
| 6,037,667 | A * | 3/2000 | Hembree et al. ............ 257/779 |
| 6,099,326 | A * | 8/2000 | Lin ................................ 439/83 |
| 6,214,716 | B1 * | 4/2001 | Akram ........................ 438/612 |
| 6,929,488 | B2 * | 8/2005 | Kung et al. .................... 439/83 |
| 7,120,999 | B2 * | 10/2006 | Canella ........................ 29/842 |

* cited by examiner

*Primary Examiner*—Ross Gushi
(74) *Attorney, Agent, or Firm*—Wei Te Chung

(57) ABSTRACT

An electrical connector includes an insulative housing adapted to engage a conductive contact (20). The conductive contact has a tail end, wherein the tail end (22) is angled and has a generally dished shape such that at least a portion of the tail end terminates within a hole (10) in a contact pad (12) of a circuit board (1). The conductive contact tail end in a dished shape has the advantages of facilitating the guiding of the tail end into or out of the hole of the circuit board during wipe actions, without removing gold plated layer, and of achieving a reliable travel of the tail end across the hole of the contact pad of the circuit board.

3 Claims, 3 Drawing Sheets

ELECTRICAL CONNECTOR WITH CONTACT

BACKGROUND OF THE INVENTION

1. Field of the Invention

The present invention relates to the art of electrical connectors, and more particularly to electrical connection between a conductive contact of an electrical connector and a contact pad of a substrate.

2. The General Background

A microelectronic package typically interconnects with a substrate member, such as a motherboard, a printed circuit board or an interposer, through the use of an electrical connector. A variety of connectors are used in the microprocessor industry, most of which provide a relatively quicker and easy interface between the microelectronic package and the substrate.

Connectors are available with various mounting technologies, including surface mount technology (SMT) and compression mount technology (CMT). SMT socket connectors use standard reflow-soldering methods for mounting to the substrate. With higher pin counts, increased force is needed for the microelectronic package to make contact, and the solder connection must be capable of withstanding this larger force. Since the solder connection alone is not a reliable mechanical means of strength, the SMT technology is limited by the package pin count. In many cases, SMT has been used in combination with pin/socket interconnects, where the insertion/extraction force has been optimized and other means of mechanical rigidity has to be provided in addition to solder strength.

CMT is very popular with high-density devices. In addition to the same layout as SMT configuration, CMT footprints require four or more mounting holes and two or more alignment holes. These holes are placed around the SMT contact pads of the substrate, which makes the footprint larger. The greatest advantage of CMT socket connectors is that they can be easily assembled and removed using mechanical hardware that makes the rework cost close to zero.

In mounting conductive contacts of the socket connector onto holes of the substrate, the conductive contact tip profile is critical for the hole defined on the contact pad of the substrate, when the conductive contact wipes across the contact pad of the substrate. That is because, if the shape of the conductive contact tip is designed to have a sharp surface or edges, the sharp surface or edges of the contact tip could reduce the contact durability due to the interference between the contact tip and the hole of the substrate. Therefore, it is contemplated that the shape of the contact tip should be designed to be within the hole of the substrate for enhanced contact durability between the contact tip and the hole of the substrate.

SUMMARY OF THE INVENTION

An electrical connector according to an embodiment of the present invention includes an insulative housing adapted to engage a conductive contact. The conductive contact has a tail end, wherein the tail end is angled and has a generally dished shape such that at least a portion of the tail end terminates within a hole, plated with a conductive material, in the contact pad of the circuit board. The dished shape of the conductive contact tail end has the advantages of facilitating the guiding of the tail end into or out of the hole of the circuit board during wipe actions, without removing gold plated layer on either the tail end or the contact pad of the circuit board, and of achieving a reliable travel of the tail end across the hole of the contact pad of the circuit board so as to form a reliable electrical connection between the conductive contact and the contact pad of the substrate through the hole.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
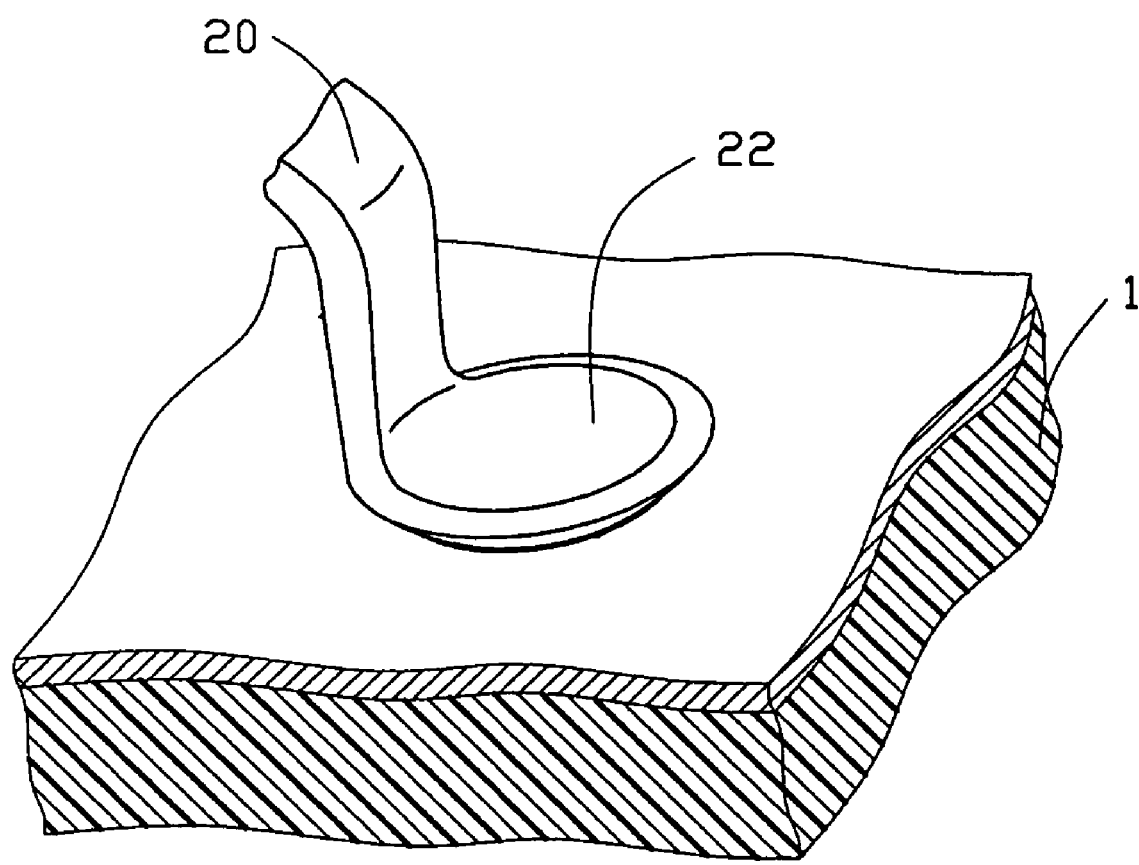
FIG. 1 is a schematic, perspective view showing a tail end of a conductive contact of a socket connector for connection to a contact pad of a circuit board according to an embodiment of the present invention.
Figure 2:
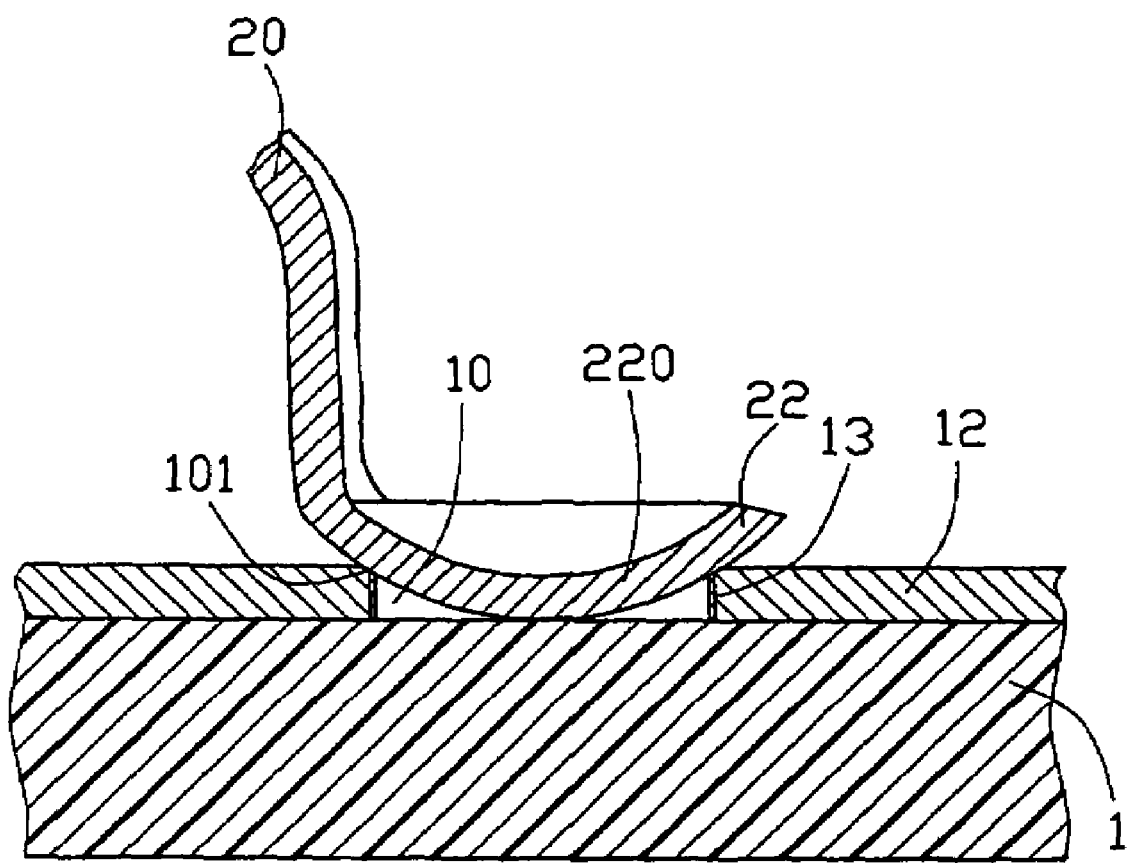
FIG. 2 is a schematic, cross-sectional view of FIG.1, showing the tail end of the conductive contact terminates within a hole of the contact pad of the circuit board.
Figure 3:
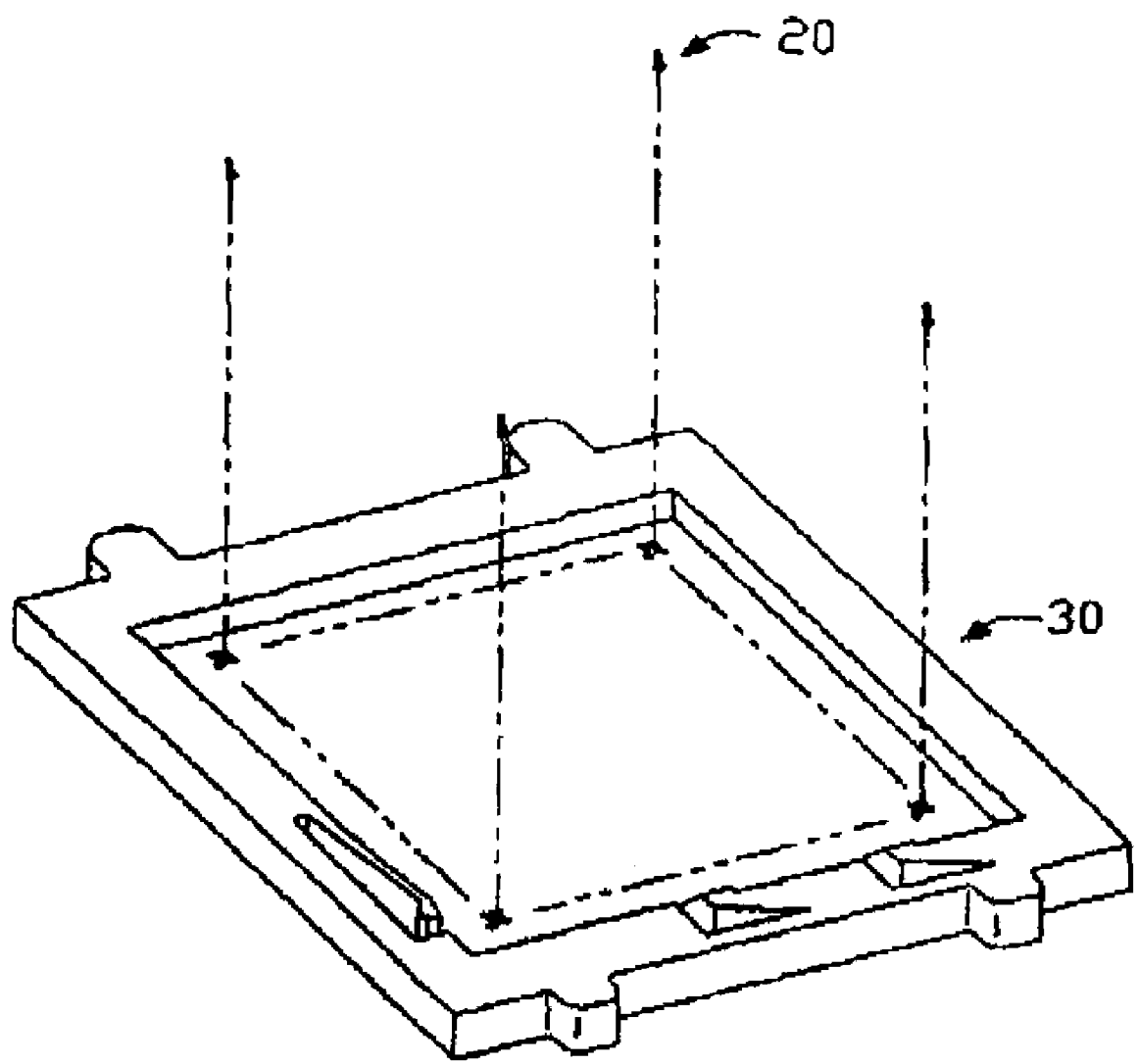
FIG. 3 is a schematic, perspective view showing the connector housing and the contacts thereof for connection to a contact pad of a circuit board according to an embodiment of the present invention.

As known in CMT, an electrical connector is employed to have its conductive contact tips within holes or wells 10 defined in contact pads 12 of the substrate 1 so as to form an electrical connection between the conductive contact tips and the respective contact pad 12 of the substrate 1 through the holes 10. The electrical connector typically includes an insulative housing, 30 preferably in a form of a substantially rectangular box (not shown), adapted to engage conductive contacts 20, arranged in rows and columns. As shown in FIGS. 1 to 3, the conductive contact 20 of this embodiment includes the contact tip or tail end, wherein the tail end includes an angled contact portion 22, the contact portion 22 has a generally dished shape with its outer contact surface 220 convex towards the hole 10 of the substrate 1. More specifically, the tail end of the conductive contact 20 has a substantially semi-spherical outer contact surface 220. However, in other embodiments, the contact portion 22 of the conductive contact 20 may have any other curvilinear outer contact surface including irregular or regular curved surface, such as a generally ellipsoidal outer contact surface, depending on various applications.

At least a portion of the dished shape of the contact portion 22 terminates within the hole 10, plated with a conductive material, such as a gold layer 13, on the contact pad 12 of the substrate 1 such that at least a portion, such as a curve line, of the semi-spherical outer contact surface 220 supportably engages wall portions of the hole 10 of the substrate 1 so as to form an electrical connection between the electrical contact 20 and the contact pad 12 of the substrate 1 through the gold-plated wall portions of the hole 10. In this embodiment, the hole 10 is a via hole, while in an alternative embodiment, the hole may be a through hole. As shown in FIG. 2, in this embodiment, the hole 10 in the contact pad 12 of the substrate 1 further includes a beveled surface 101 on a top portion thereof such that the semi-spherical outer contact surface 220 of the conductive contact 20 has its surface region, rather than the curve line, supportably engages the gold-plated wall portions of the hole 10 of the substrate 1, for increased contact area between the conductive contact 20 and the contact pad 12 of the substrate 1 through the gold-plated wall portions of the hole 10. The conductive contact tip or tail end with a smooth semi-spherical contact surface 220 thereof has the advantages of facilitating the guiding of the contact tip into or out of the hole 10 of the substrate 1 during wipe actions, without removing the gold plated layer on either the contact tip or the hole 10 on the contact pad 12 of the substrate 1, and of achieving a reliable travel of the conductive contact tip across the hole 10 of the contact pad 12 of the substrate 1 so as to form a reliable electrical connection between the conductive contact 20 and the contact pad 12 of the substrate 1 through the gold-plated hole 10.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical assembly for connecting a chip module with a printed circuit board comprising;
    a contact pad formed on a printed circuit board;
    a recess defined in said contact pad;
    an insulative housing holding a conductive contact;
    the conductive contact having a tail end wherein the tail end is angled with respective to other portions and has a generally non-flat such that at least a portion of tail end is embedded in the recess of the contact pad, thus resulting in a non-planar engagement therebetween; and
    wherein said recess is essentially a through hole in said contact pad; wherein a bottom tip of said tail end touches the insulative area below the contact pad of said printed circuit board.

2. The electrical connector of claim 1, wherein the tail end of the conductive contact has a generally semi-spherical outer contact surface.

3. The electrical assembly of claim 1, wherein the engagement between the tail end and the recess, occurs at a round edge of said recess with and upper planar surface of said contact pad.

* * * * *